United States Patent
Gao et al.

(10) Patent No.: US 9,258,877 B2
(45) Date of Patent: Feb. 9, 2016

(54) PATTERNED TRANSPARENT CONDUCTIVE FILM BASED ON RANDOM GRID

(71) Applicant: NANCHANG O-FILM TECH. CO., LTD., Jiangxi (CN)

(72) Inventors: Yulong Gao, Jiangxi (CN); Zheng Cui, Jiangsu (CN); Fei Zhou, Jiangxi (CN)

(73) Assignee: Nanchang O-Film Tech Co., Ltd., Jiangxi (CN)

( * ) Notice: Subject to any disclaimer, the term of this patent is extended or adjusted under 35 U.S.C. 154(b) by 188 days.

(21) Appl. No.: 13/985,880

(22) PCT Filed: Dec. 20, 2012

(86) PCT No.: PCT/CN2012/087078
§ 371 (c)(1),
(2) Date: Aug. 16, 2013

(87) PCT Pub. No.: WO2013/166841
PCT Pub. Date: Nov. 14, 2013

(65) Prior Publication Data
US 2014/0083742 A1 Mar. 27, 2014

(30) Foreign Application Priority Data
May 9, 2012 (CN) .......................... 2012 1 0141853

(51) Int. Cl.
H05K 1/02 (2006.01)
G06F 3/041 (2006.01)
H01L 31/0224 (2006.01)

(52) U.S. Cl.
CPC *H05K 1/02* (2013.01); *G06F 3/041* (2013.01); *H01L 31/022466* (2013.01)

(58) Field of Classification Search
CPC ........................................................ H05K 1/02
See application file for complete search history.

(56) References Cited

U.S. PATENT DOCUMENTS

2007/0264530 A1 11/2007 Takada et al.
2011/0250387 A1* 10/2011 Zagdoun et al. .............. 428/131
2013/0189502 A1 7/2013 Takahashi et al.

FOREIGN PATENT DOCUMENTS

JP S64-49302 A 2/1989
JP 2001-284879 A 10/2001
(Continued)

OTHER PUBLICATIONS

Communication from the Korean Patent Office Regarding a Counterpart Foreign Application Dated Aug. 25, 2015.

*Primary Examiner* — Jeremy C Norris
(74) *Attorney, Agent, or Firm* — Rosenberg, Klein & Lee

(57) ABSTRACT

The present invention discloses a patterned transparent conductive film based on the random grid, wherein the surface of the conductive film can be divided into a conductive region and an insulating region, with the conductive region having the grid made of metal. The grid of the conductive region, composed of the grid line of the conductive region, is a random grid having an irregular shape, and can avoid periodic shielding generated by the opaque metal grid lines and the periodic pixel unit of LCD. The patterned transparent conductive film provided by the present invention is composed of the irregular random grid, and therefore will not generate the Moire stripe. Besides, finally by naked eyes observation, the conductive region and the insulating region have exactly the same or close transmittance, and therefore will not generate the grayscale contrast.

19 Claims, 5 Drawing Sheets

(56) References Cited

FOREIGN PATENT DOCUMENTS

| JP | 2010-286886 A | 12/2010 |
| JP | 4862969 B1 | 1/2012 |
| KR | 10-2007-0074559 A | 7/2007 |

* cited by examiner

PATTERNED TRANSPARENT CONDUCTIVE FILM BASED ON RANDOM GRID

FIELD OF THE INVENTION

The present invention relates to a conductive film, more specifically to a patterned transparent conductive film based on a random grid.

BACKGROUND OF THE INVENTION

The transparent conductive film is a film having good electrical conductivity, and a high visible light transmittance. The transparent conductive film has been widely used in flat panel displays, photovoltaic devices, touch panels and electromagnetic shielding, and other fields, having a very broad market space.

ITO has dominated the market of the transparent conductive film. However, in most practical applications such as a touch screen, production processes including exposure, development, etching, cleaning, and so on, need to be carried out to make the transparent conductive film patterned, i.e. a fixed conductive region and an insulating region are formed on the surface of the substrate based on the patterned design. In comparison, forming a metal grid directly on a specified region of the substrate by means of the printing method can eliminate the need for a patterned process, and has such advantages as low pollution and low cost. The grid line is made of a metal having good electrical conductivity and which is impenetrable to light, with the line width below resolution of the human eye; a region without lines is a light transmitting region. The surface square resistance and light transmittance of the transparent conductive film can be controlled within a certain range by changing width and grid shape of the lines.

Japanese companies, Dai Nippon Printing, Fuji Film and Gunze, and German company, PolyIC all use the printing method and obtain the patterned transparent conductive film having excellent properties. Wherein the graph obtained by PolyIC has a resolution of 15 um, a surface square resistance of 0.4-1 Ω/sq, and a light transmittance greater than 80%.

The above metal grid film is generally designed according to graphs, with the metal grid of a regular shape laid in the conductive region; however, the insulating region is blank.

In the prior art of preparing the patterned transparent conductive film, compared with the traditional ITO film, forming the metal grid directly in the specified region of the flexible substrate material by means of a printing method or a silver salt method can eliminate the need for a patterned process, and has such advantages as low pollution and low cost. However, the existing metal grid is mostly a grid of a regular shape, and may produce obvious Moire stripe in application. Besides, the conductive region of the film has the metal grid, while the insulating region does not, and this transmittance difference may make users vaguely see the graphs in the conductive region, thus affecting the overall appearance.

Therefore, the prior art has the following defects:

The Moire stripe phenomenon: the conductive region of the film is a grid having an irregular shape, and attaching this transparent conductive film to the surface of LCD may cause obvious Moire stripe, which influences the visual effect. This is because the LCD pixel unit is a rectangular unit having an irregular shape, and between the pixels are black lines that have a regular shape and a periodic distribution. However, the periodic opaque lines of the conductive film may form a periodic shelter with the black lines of LCD, which further macroscopically appear to be the Moire stripe phenomenon.

In addition, due to the same principle, the significant Moire stripe can also be produced through lamination of two pieces of the regular grid conductive film. This phenomenon undoubtedly severely restricts application of the patterned transparent conductive film based on the metal grid.

Transmittance difference: The conductive region of the film has the metal grid, whose transmittance will be attenuated following the shading ratio of the grid lines; while the insulating region does not have the grid lines, and therefore the transmittance of this region is certainly greater than that of the conductive region. When applied to the display field, this transmittance difference may make users vaguely see the graphs in the conductive region, thus affecting the overall appearance.

SUMMARY OF THE INVENTION

In order to overcome the shortcomings of the prior art, a purpose of the present invention is to provide a patterned transparent conductive film based on the random grid.

Another purpose of the present invention is to use a grid having an irregular shape, so as to avoid periodic line coincidence with the regular grid, thereby completely avoiding generation of Moire stripe. Besides, random grid lines without electrical connection are laid in the insulating film region, so as to eliminate the transmittance difference.

The present invention adopts the following technical solution:

A patterned transparent conductive film based on the random grid is provided, having a surface that can be divided into a conductive region and an insulating region, with the conductive region having the grid made of metal; the grid of the conductive region, composed of the grid line of the conductive region, is a random grid having an irregular shape, and can avoid periodic shielding generated by the opaque metal grid lines and the periodic pixel unit of LCD.

In another aspect of the present invention, the insulating region has a grid made of metal, which is composed of grid lines of the insulating region; the grid of the insulating region is a random grid having an irregular shape; a transmittance difference between the conductive region and the insulating region is less than 2%.

In another aspect of the present invention, the grid line of the conductive region is distributed evenly in each angle direction.

In another aspect of the present invention, the grid line of the insulating region is distributed evenly in each angle direction.

In another aspect of the present invention, the grid line of the random grid has a trench structure.

In another aspect of the present invention, the random grid of the conductive region is a grid composed of irregular polygons.

In another aspect of the present invention, the random grid of the insulating region is a grid composed of irregular polygons or an irregular polygon grid having a disconnected node.

In another aspect of the present invention, the random grid of the conductive region and the insulating region satisfies the following conditions: the grid line of the random grid is a straight line segment, and forms an evenly-distributed angle θ with the rightward horizontal X axis, the uniform distribution referring to the statistic value θ of each of the random grids; then gathering statistics for a probability $p_i$ of the grid lines falling within each of the angle intervals at a stepper angle of 5°, thus obtaining $p_1, p_2 \ldots p_{36}$ in the 36 angle intervals within 0~180°; $p_i$ satisfies that the standard deviation is less than 20% of an arithmetic mean.

In another aspect of the present invention, the grid line of the insulating region is insulated from that of the conductive region.

In another aspect of the present invention, the grid line of the insulating region is insulated from that of the conductive region in the following ways: The grid lines of the insulating region are interconnected, while the grid line of the insulating region is disconnected from that of the conductive region; or the grid of the insulating region is composed of grid lines having no nodes and which are disconnected from each other.

In another aspect of the present invention, the least distance between both endpoints of the disconected grid lines for every two of them in the grid of the insulating region is less than 30 microns.

The present invention uses a novel printing technology, and can prepare the patterned transparent conductive film having a resolution less than 3 um, a surface square resistance of less than 10 Ω/sq, and a light transmittance of greater than 87%.

The present invention has the following beneficial effects:

The patterned transparent conductive film provided by the present invention comprises the irregular random grid. The lines of the random grid are distributed evenly in each angular direction, and thus avoid periodic shielding generated by the opaque metal grid lines and the periodic pixel unit of LCD, thus avoiding generation of Moire stripe in principle, making a breakthrough in the technical bottleneck that has plagued the application of the metallic grid transparent conductive film to the LCD surface.

The patterned transparent conductive film provided by the present invention also likewise has the random grid having an irregular shape in the insulating region. Both the conductive region and the insulating region have the similar random grid and an optical transmittance difference less than 2% between them, and therefore will not produce a gray difference visible to the naked eye.

DETAILED DESCRIPTION

The specific examples of this technical solution will be described further in detail below with reference to diagrams.

Example 1

Figure 1:
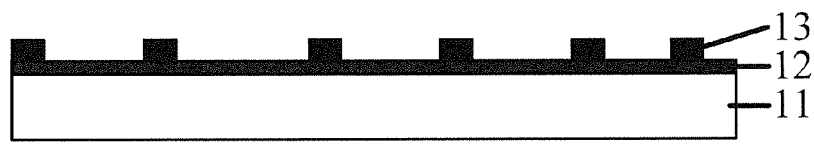
FIG. 1 is a cross-sectional schematic diagram of the flexible transparent conductive film of the present invention.
Figure 2:
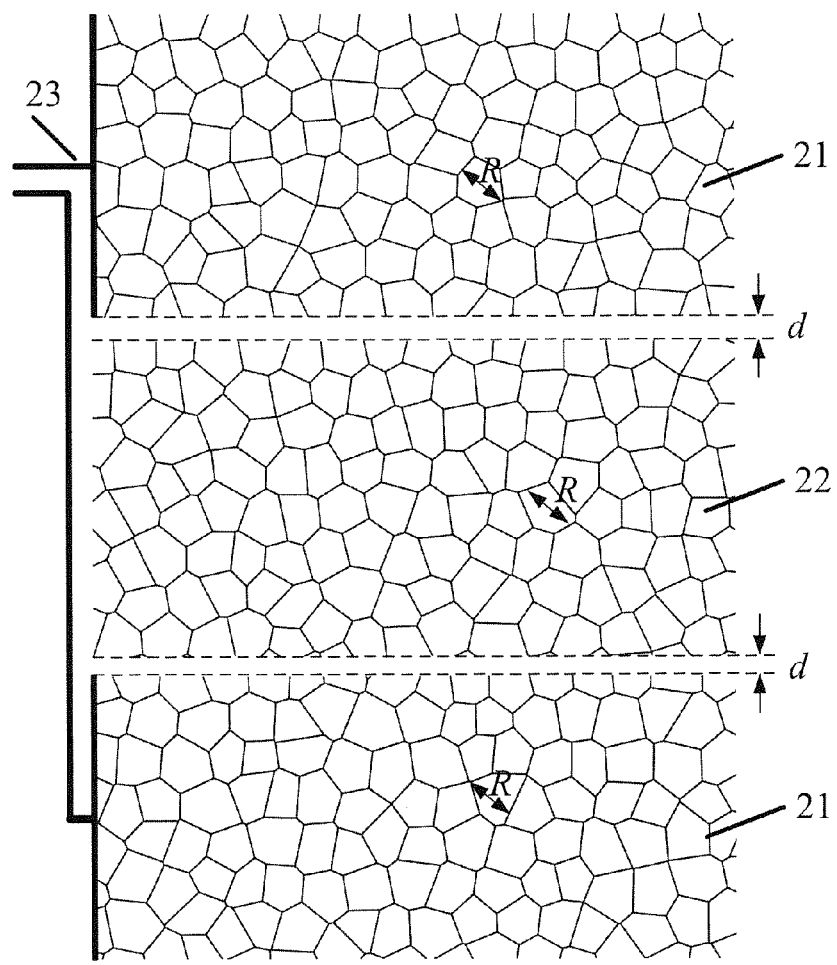
FIG. 2 is a plane schematic diagram of the flexible transparent conductive film of the present invention.

In this example, the cross-sectional schematic diagram and the plane schematic diagram of the patterned flexible transparent conductive film are as shown in FIGS. 1 and 2, respectively, with the film composed of PET 11, the surface of an adhesion-promoting layer 12, and a conductive silver grid 13 from bottom to top. The metal grid 12 is all made of silver, with the silver grid having a line width of 10 μm and an average thickness of 400 nm. The film surface includes a conductive region 21 and an insulating region 22, inside both of which are laid irregular polygon random grids having the same grid density, with the average diameter R of the grids being 400 μm.

Figure 3:
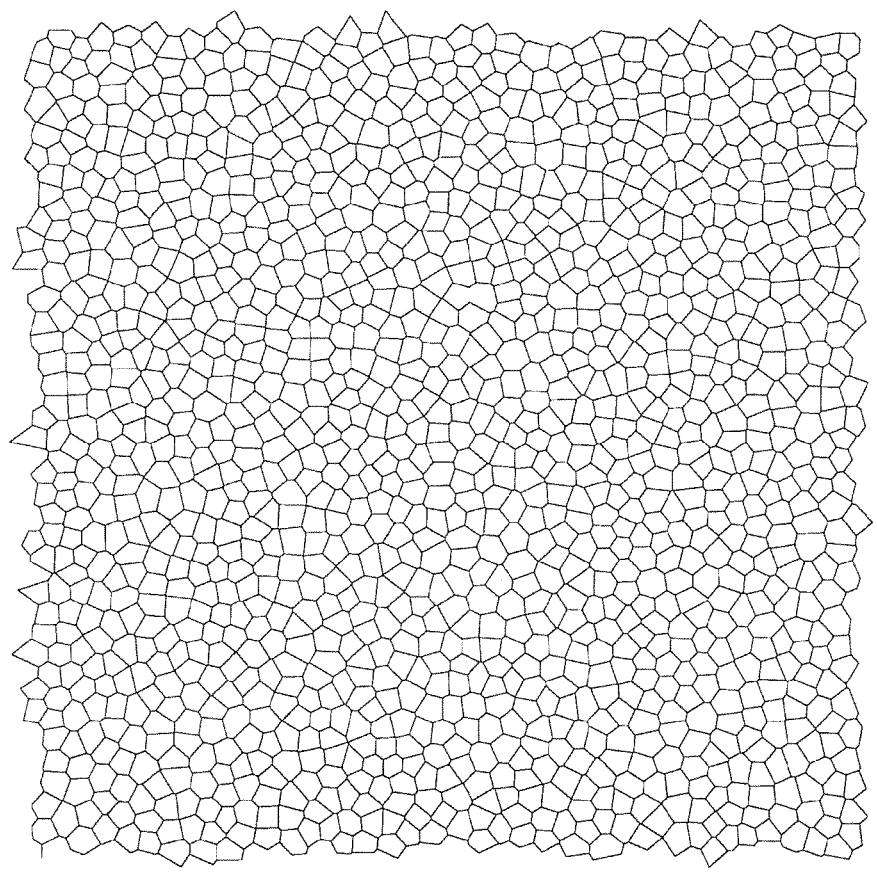
FIG. 3 is a schematic diagram of the random grid of the flexible transparent conductive film of the present invention.

In this example, the random grid is an isotropic irregular polygon grid, and the angle distribution of its grid line will be analyzed below by taking a random grid having an area of 5 mm×5 mm as shown in FIG. 3 as an example.

Figure 4:
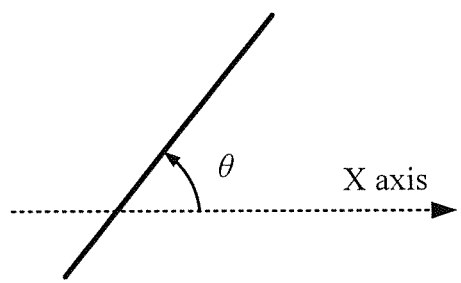
FIG. 4 shows the angle θ formed by each line segment of the flexible random grid of the present invention with the X axis.
Figure 5:
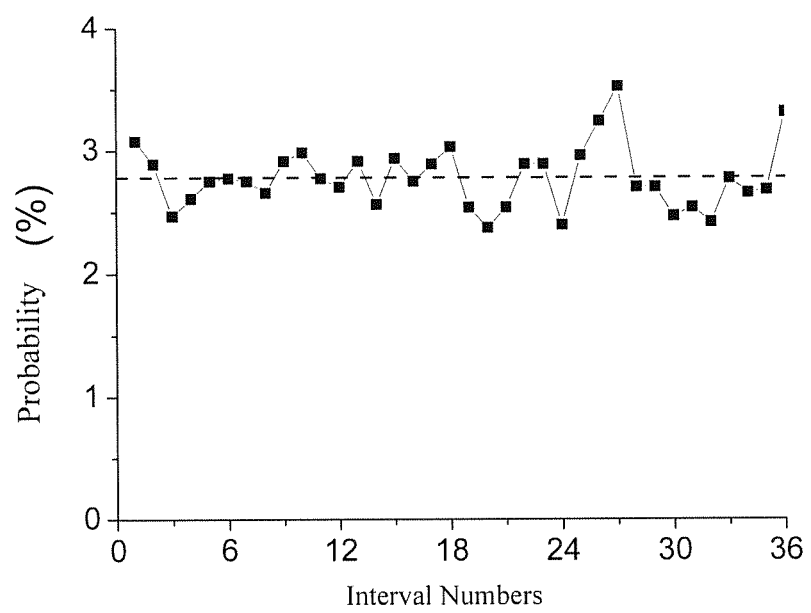
FIG. 5 shows the distribution of the probability p of the angle formed by each line segment of the flexible random grid of the present invention with the X axis.

The random grid as shown in FIG. 3 includes 4257 line segments in total. As shown in FIG. 4, statistics of an angle θ formed between each line segment and the X axis provides a one-dimensional array of θ(1)~θ(4257); then 0~180° is divided into 36 angle intervals at an interval of 5°; statistics of the probability p of the line segments falling within each interval provides a one-dimensional array of p(1)~p(36), as shown in FIG. 5; finally the standard deviation s can be calculated to be 0.26% according to the following standard deviation calculation formula:

$$s = \sqrt{\frac{(p_1 - \overline{p})^2 + (p_2 - \overline{p})^2 + \ldots (p_n - \overline{p})^2}{n}}$$

where n is 36, with the average probability $\overline{p}$ being 2.78%. Therefore, $s/\overline{p}$=9.31%. It is thus clear that the grid lines of the above random grid have a very uniform angular distribution, and can effectively avoid generation of Moire stripe.

The conductive region 21 and the insulating region 22 are separated from each other through a blank region having a width d, thus achieving electrical isolation. Width d in this example is 10 μm, which is tested to be invisible. The conductive region is led out by a silver conductive wire 23. Because the conductive region and the insulating region are completely identical in grid type and density, they are also consistent in transmittance, thus would not generate the grayscale change.

Example 2

Figure 6:
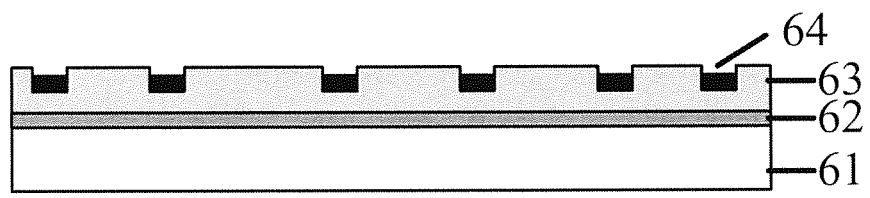
FIG. 6 is a cross-sectional schematic diagram of the embedded flexible transparent conductive film of the present invention.

In this example, the cross-sectional schematic diagram of the patterned flexible transparent conductive film is as shown in FIG. 6. The film is composed of the following components from bottom to top: PET 61, having a thickness of 188 μm; an adhesion-promoting layer 62; an acrylic UV adhesive 13 with a trench structure, having a trench depth of 3 μm and a trench width of 2.2 μm; the trench is filled with the metal silver 64 having a thickness of about 2 μm, less than the trench depth.

Figure 7:
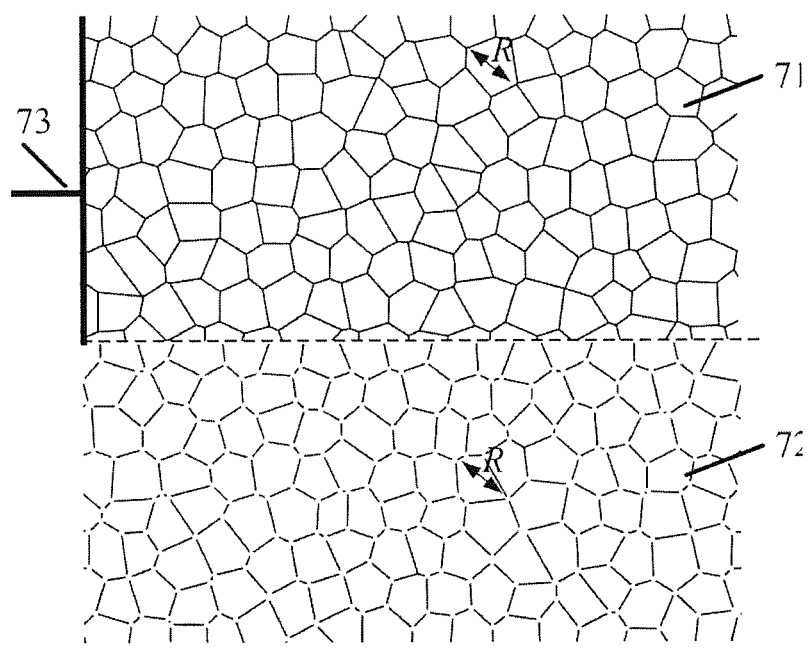
FIG. 7 is a plane schematic diagram of the embedded flexible transparent conductive film of the present invention.

The plane schematic diagram of the patterned flexible transparent conductive film of this example is as shown in FIG. 7. The film surface includes a conductive region 71 and an insulating region 72, inside both of which are laid irregular polygon random grids having the same grid density, with the average diameter R of the grids being all preferably 120 μm. The conductive region 71 and the insulating region 72 are separated from each other through a blank region having a width of d. d in this example is preferably 3 μm, which is tested to be invisible. All the grid nodes of the insulating region 72 are disconnected, which is done in this example preferably as follows: canceling the trench structure within a radius of 3 μm by taking each node as the center. After preparation of the above patterned transparent conductive film, the conductive region is led out through a silk wire 73 prepared by the screen printing technology.

The random grid type used in this example is consistent with Example 1, and therefore no Moire stripe will be generated, either. Because the insulating region is composed of isolated grid lines disconnected from each other, the complete electrical non-conductivity can thus be achieved.

In this example, the selected PET has an average transmittance of 91.4% in the visible band, and the grids of the conductive region and the insulating region have a relative transmittance of 96% and 96.2%, respectively. Thus they both have a transmittance of 87.72% and 87.93%, respectively, with a difference of 0.21%. This transmittance difference is tested to be imperceptible with the naked eye, and therefore will not generate the obvious grayscale contrast.

Example 3

Figure 8:
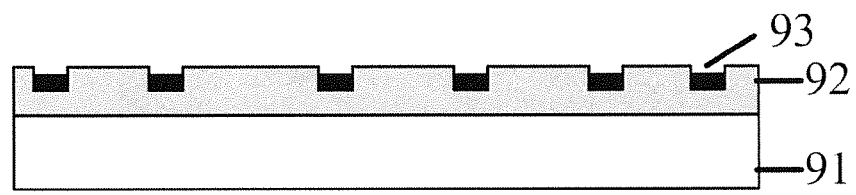
FIG. 8 is a cross-sectional schematic diagram of the embedded transparent conductive film of the present invention.

In this example, the cross-sectional schematic diagram of the patterned transparent conductive film is as shown in FIG. 8. The film is composed of the following components from bottom to top: a hard glass substrate 91, having a thickness of 1 mm; an acrylic UV adhesive 92 with a trench structure, having a trench depth of 3 μm and a width of 2.2 μm; the trench is filled with the metal silver 93 having a thickness of about 2 μm, less than the trench depth.

Figure 9:
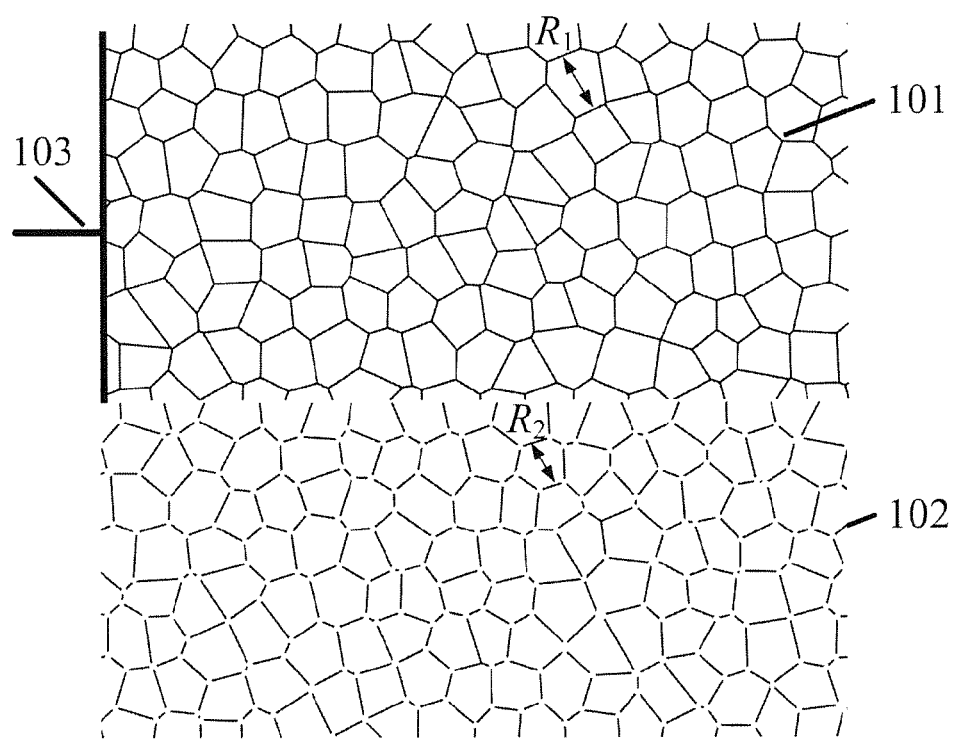
FIG. 9 is a plane schematic diagram of the embedded transparent conductive film of the present invention.

The plane schematic diagram of the patterned transparent conductive film of this example is as shown in FIG. 9. The film surface still includes a conductive region 101 and an insulating region 102, inside both of which are laid irregular polygon random grids having the same grid density. The grids of the conductive region 101 all preferably have an average diameter $R_1$ of 120 μm, while the grids of the insulating region 102 preferably have an average diameter $R_2$ of 118 μm. All the grid nodes of the insulating region 102 are disconnected, which is done in this example preferably as follows: canceling the trench structure within a radius of 3 μm by taking each node as the center. After preparation of the above patterned transparent conductive film, the conductive region is led out through a silk wire 103 prepared by the screen printing technology.

Thus the patterned transparent conductive film described in this example, while being attached to the surface of LCD, will not generate the Moire stripe. Because the insulating region is composed of isolated grid lines disconnected from each other, the complete electrical non-conductivity can thus be achieved. In this example, the selected PET has an average transmittance of 91.4% in the visible band, and the grids of the conductive region and the insulating region all have a relative transmittance of 96%. Thus both have a transmittance of 87.72%. Therefore, the grayscale contrast will not be generated.

In another embodiment of the present invention, the random grid of the irregular conductive region can also have an irregular honeycomb structure; the random grid of the irregular insulating region can also have an irregular honeycomb structure.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A patterned transparent conductive film based on a random grid, wherein:
    a surface of the conductive film is divided into a conductive region and an insulating region;
        the conductive region having a grid made of metal; the grid of the conductive region is composed of a grid line of the conductive region, the grid of the conductive region is a random grid having an irregular shape, which can avoid periodic shielding generated by opaque metal grid lines and periodic pixel units of LCD; and
        the insulating region having a grid made of metal, which is composed of grid lines of the insulating region; the grid of the insulating region is a random grid having an irregular shape.

2. The patterned transparent conductive film based on the random grid according to claim 1, wherein a transmittance difference between the conductive region and the insulating region is less than 2%.

3. The patterned transparent conductive film based on the random grid according to claim 2, wherein the grid line of the random grid has a trench structure.

4. The patterned transparent conductive film based on the random grid according to claim 2, wherein the random grid of the conductive region is a grid comprising irregular polygons.

5. The patterned transparent conductive film based on the random grid according to claim 1, wherein the grid line of the conductive region is distributed evenly in each angular direction.

6. The patterned transparent conductive film based on the random grid according to claim 5, wherein the grid line of the random grid has a trench structure.

7. The patterned transparent conductive film based on the random grid according to claim 5, wherein the random grid of the conductive region is a grid comprising irregular polygons.

8. The patterned transparent conductive film based on the random grid according to claim 1, wherein the grid line of the insulating region is distributed evenly in each angular direction.

9. The patterned transparent conductive film based on the random grid according to claim 8, wherein the grid line of the random grid has a trench structure.

10. The patterned transparent conductive film based on the random grid according to claim 8, wherein the random grid of the conductive region is a grid comprising irregular polygons.

11. The patterned transparent conductive film based on the random grid according to claim 8, wherein the random grid of the insulating region is a grid comprising irregular polygons or an irregular polygon grid having a disconnected node.

12. The patterned transparent conductive film based on the random grid according to claim 8, wherein the random grid of the conductive region and the insulating region satisfies the following conditions: the grid line of the random grid is a straight line segment, and forms an evenly-distributed angle $\theta$ with the rightward horizontal X axis, the uniform distribution referring to the statistic value $\theta$ of each of the random grids; then gathering statistics for a probability $p_i$ of the grid lines falling within each of angle intervals at a stepper angle 5°, thus obtaining $p_1, p_2 \ldots p_{36}$ in the 36 angle intervals within 0~180°; $p_i$ satisfies that the standard deviation is less than 20% of an arithmetic mean.

13. The patterned transparent conductive film based on the random grid according to claim 1, wherein the grid line of the random grid has a trench structure.

14. The patterned transparent conductive film based on the random grid according to claim 1, wherein the random grid of the conductive region is a grid comprising irregular polygons.

15. The patterned transparent conductive film based on the random grid according to claim 1, wherein the random grid of the insulating region is a grid comprising irregular polygons or an irregular polygon grid having a disconnected node.

16. The patterned transparent conductive film based on the random grid according to claim 1, wherein the random grid of the conductive region and the insulating region satisfies the following conditions: the grid line of the random grid is a straight line segment, and forms an evenly-distributed angle θ with the rightward horizontal X axis, the uniform distribution referring to the statistic value θ of each of the random grids; then gathering statistics for a probability $p_i$ of the grid lines falling within each of angle intervals at a stepper angle 5°, thus obtaining $p_1, p_2 \ldots p_{36}$ in the 36 angle intervals within 0~180°; $p_i$ satisfies that the standard deviation is less than 20% of an arithmetic mean.

17. The patterned transparent conductive film based on the random grid according to claim 1, wherein the grid line of the insulating region is insulated from that of the conductive region.

18. The patterned transparent conductive film based on the random grid according to claim 17, wherein the grid line of the insulating region is insulated from that of the conductive region in the following ways: the grid lines of the insulating region are interconnected, while the grid line of the insulating region is disconnected from that of the conductive region; or the grid of the insulating region is composed of grid lines having no node and disconnected from each other.

19. The patterned transparent conductive film based on the random grid according to claim 18, wherein the least distance between both endpoints of the grid lines disconnected from each other for every two of them in the grid of the insulating region is less than 30 microns.

\* \* \* \* \*